United States Patent [19]

Jones

[11] Patent Number: 5,543,710
[45] Date of Patent: Aug. 6, 1996

[54] NMR CONFORMAL SOLENOIDAL COIL

[75] Inventor: Randall W. Jones, Elkhorn, Nebr.

[73] Assignee: Board of Regents of Univ. of NE, Lincoln, Nebr.

[21] Appl. No.: 199,051

[22] Filed: Feb. 22, 1994

[51] Int. Cl.$^6$ .............................. G01V 3/00; G01V 3/14; A61B 5/055
[52] U.S. Cl. ................ 324/318; 324/322; 128/653.5
[58] Field of Search ..................... 324/318, 319, 324/322, 300, 314; 364/413.13, 413.3; 128/653.5

[56] References Cited

U.S. PATENT DOCUMENTS

| 4,766,383 | 8/1988 | Fox et al. | 324/318 |
|---|---|---|---|
| 4,887,038 | 12/1989 | Votruba et al. | 324/318 |
| 5,057,777 | 10/1991 | Kurczewski | 324/318 |
| 5,072,184 | 12/1991 | Dickinson | 324/318 |
| 5,185,577 | 2/1993 | Minemura | 324/318 |
| 5,196,796 | 3/1993 | Misic et al. | 324/322 |
| 5,327,898 | 7/1994 | Yoshino | 324/318 X |
| 5,351,688 | 10/1994 | Jones | 324/318 |
| 5,361,764 | 12/1994 | Reynolds | 324/318 X |

Primary Examiner—Sandra L. O'Shea
Assistant Examiner—Mack Haynes
Attorney, Agent, or Firm—Zarley, McKee, Thomte, Voorhees & Sease; Mark D. Frederiksen

[57] ABSTRACT

A NMR conformal solenoidal coil includes a generally cylindrical parallel-wound solenoidal coil which can be oriented at any angle within the plane transverse to the static magnetic field. The cylindrical shape has been modified to conform to fit closely over hands, wrist, and feet. One end remains circular while the opposite is oval. A diagonal winding of the conductors about the generally cylindrical form are in parallel with the diagonally cut ends of the coil form, such that the coil windings are in a plane orthogonal to the transverse plane; thereby optimizing their efficiencies.

5 Claims, 3 Drawing Sheets

1

NMR CONFORMAL SOLENOIDAL COIL

TECHNICAL FIELD

The present invention relates generally to magnetic resonance imaging (MRI) and more particularly to local coils for use in receiving MRI signals.

BACKGROUND OF THE INVENTION

A. Magnetic Resonance Imaging

Magnetic resonance imaging (MRI) refers generally to a form of clinical imaging based upon the principles of nuclear magnetic resonance (NMR). Any nucleus which possesses a magnetic moment will attempt to align itself with tile direction of a magnetic field, the quantum alignment being dependent, among other things, upon the strength of the magnetic field and the magnetic moment. In MRI, a uniform magnetic field $B_0$ is applied to an object to be imaged; hence creating a net alignment of the object's nuclei possessing magnetic moments. If the static field $B_0$ is designated as aligned with the z axis of a Cartesian coordinate system, the origin of which is approximately centered within the imaged object, the nuclei which posses magnetic moments precess about the z-axis at their Larmor frequencies according to their gyromagnetic ratio and the strength of the magnetic field.

Water, because of its relative abundance in biological tissues and its relatively strong net magnetic moment $M_z$ created when placed within a strong magnetic field, is of principle concern in MR imaging. Subjecting human tissues to a uniform magnetic field will create such a net magnetic moment from the typically random order of nuclear precession about the z-axis. In a MR imaging sequence, a radio frequency (RF) excitation signal, centered at the Larmor frequency, irradiates the tissue with a vector polarization which is orthogonal to the polarization of $B_0$. Continuing our Cartesian coordinate example, the static field is labeled $B_z$ while the perpendicular excitation field $B_1$ is labeled $B_{xy}$. $B_{xy}$ is of sufficient amplitude and duration in time, or of sufficient power to nutate (or tip) the net magnetic moment into the transverse (x-y) plane giving rise to $M_{xy}$. This transverse magnetic moment begins to collapse and re-align with the static magnetic field immediately after termination of the excitation field $B_1$. Energy gained during the excitation cycle is lost by the nuclei as they re-align themselves with $B_0$ during the collapse of the rotating transverse magnetic moment $M_{xy}$.

The energy is propagated as an electromagnetic wave which induces a sinusoidal signal voltage across discontinuities in closed-loop receiving coils. This represents the NMR signal which is sensed by the RF coil and recorded by the MRI system. A slice image is derived from the reconstruction of these spatially-encoded signals using well known digital image processing techniques.

B. Local Coils

The diagnostic quality or resolution of the image is dependent, in part, upon the sensitivity and homogeneity of the receiving coil to the weak NMR signal. RF coils, or "local coils" may be described as resonant antennas, in part, because of their property of signal sensitivity being inversely related to the distance from the source. For this reason, it is important to place the coils as close to the anatomical region-of-interest (ROI) as possible.

Whereas "whole body" MRI scanners are sufficiently large to receive and image any portion of the entire human body, local coils are smaller and therefore electromagnetically couple to less tissue. Coupling to less tissue gives rise to coupling to less "noise" or unwanted biologically or thermally generated random signals which superimpose upon the desired MR signal. The local coils may be of higher quality factor (Q) than the body coils due to their smaller size. For all of these reasons, local coils typically yield a higher signal-to-noise (SNR) ratio than that obtainable using the larger whole body antenna. The larger antenna is commonly used to produce the highly homogenous or uniform excitation field throughout the ROI, whereas the receiver coil is placed near the immediate area of interest to receive the NMR signal. The importance of accurate positioning leads to the development of local coils which conform to the anatomy of interest, yet function to permit ease of use.

Accurate positioning of the coil's conducting loops is important for optimizing the sensitivity to the changing magnetic flux of the MR signal. The x and y components of the decaying transverse magnetization vector give rise to the changing flux which can be sensed by the local coils. The longitudinal or Z component of flux cannot be detected by the coils to contribute to the MR image as it is not changing polarity at the precessional frequency such as are the transverse components. The coils and receiver system are tuned to this precessional frequency for the reasons discussed above.

Coil geometries which are sensitive to both the transverse and longitudinal components are less efficient than similarly sized coils sensitive to only the transverse component. Coil efficiency is the magnetic field per unit current (H/I) upon the conductor and provides an indication as to the ability to resolve small signals from a noisy environment. For this reason it is important to place conductor geometries such that they are sensitive entirely to the transverse component of the precessing nuclei.

SUMMARY OF THE INVENTION

It is an object of the present invention to provide an improved NMR local coil designed to conform to a patient's particular anatomical region and place antenna conductors within close proximity to the entirety of said anatomy.

Another object of the present invention is to provide an improved electronic configuration of coil conductors which yields a higher SNR and improved homogeneity of sensitivity profiles (within small regions-of-sensitivity) than prior art versions.

The NMR conformal solenoidal coil of the present invention includes a generally cylindrical parallel-wound solenoidal coil which can be oriented at any angle within the plane transverse to the static magnetic field. The cylindrical shape has been modified to conform to fit closely over hands, wrist, and feet. One end remains circular while the opposite is oval; thus accommodating the more oval cross-section of the hand or foot on one end and the more circular cross section of the wrist on the opposite end. A diagonal winding of the conductors about the generally cylindrical form are in parallel with the diagonally cut ends of the coil form. This facilitates positioning over the patient anatomy where the arm or foot are in a natural position, and where the coil windings are inherently in a plane orthogonal to the transverse plane; thereby optimizing their efficiencies.

The foregoing and other objects and advantages of the invention will appear from the following description. In the description, reference is made to the accompanying drawings which form a part hereof and in which there is shown by way of illustration, a preferred embodiment of the invention. Such embodiment does not necessarily represent the full scope of the invention, however, and reference must be made therefore to the claims herein for interpreting the scope of the invention.

DESCRIPTION OF THE PREFERRED EMBODIMENT

Figure 1:
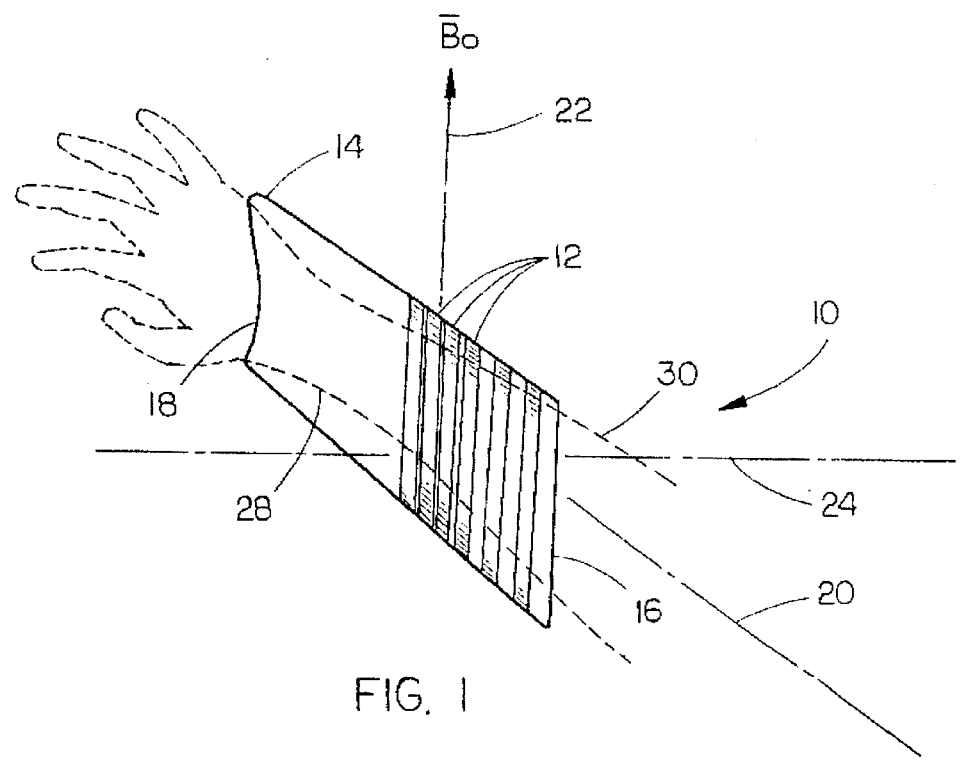
FIG. 1 is a side elevational view of the NMR conformal solenoidal coil of the present invention, with patient anatomy shown in broken lines.
Figure 2:
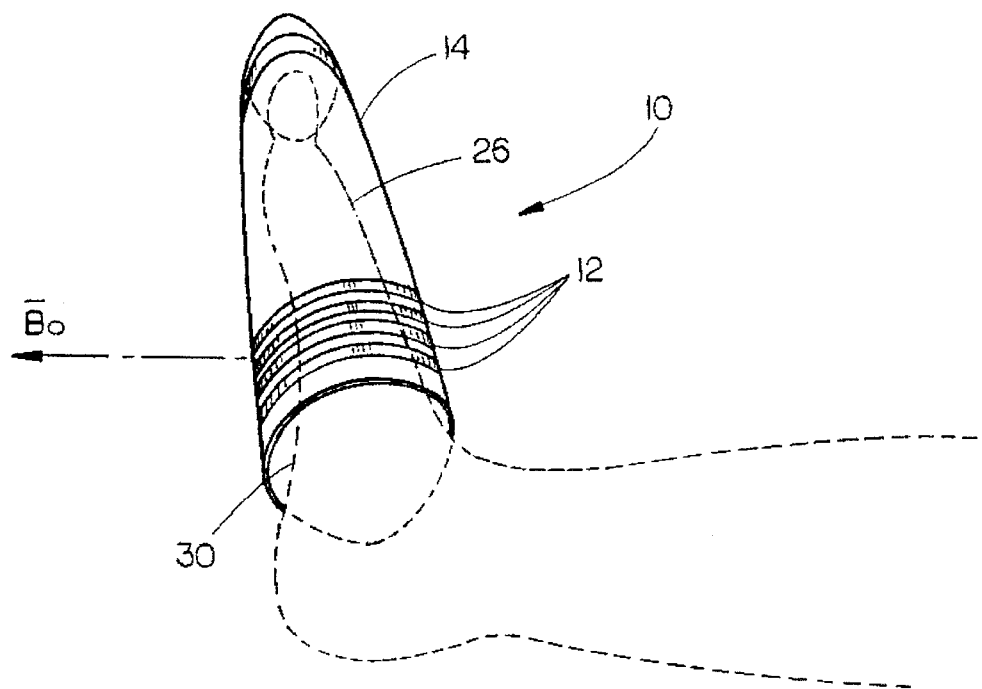
FIG. 2 is a perspective view of the NMR conformal solenoidal coil of the present invention, with patient anatomy shown in broken lines.

Referring now to the drawings, in which similar or corresponding parts are identified with the same reference numeral, and more particularly to FIGS. 1 and 2, the NMR conformal solenoidal coil of the present invention is designated generally at 10 and consists of a plurality of spaced-apart flat foil conductors 12 wound generally transverse about a generally cylindrical tubular plastic form 14 all of which is surrounded by an outer plastic housing (not shown).

The plastic form 14 has a generally circular cross-section on the proximal end 16 and has a generally elliptical cross-section on the distal end 18. The coil conductors 12 are wound in a parallel fashion about the form 14, but are oriented at an angle with respect to the longitudinal axis 20 of the generally cylindrical form 14. Each conductor loop 12 lies in a plane parallel to the static magnetic field $B_0$ designated by arrow 22 and orthogonal to the transverse XY plane 24 of the imaging system. This configuration is created to accommodate a patient's wrist positioned above the head and therefore positions the longitudinal axis 20 of the wrist joint at some angle to the transverse plane 24 of the imaging system. Each loop 12 of the parallel-wound-solenoidal coil 10 is in a plane which maximizes sensitivity to the transverse magnetic moment of the NMR signal.

The plastic form 14 is cut diagonally relative to the longitudinal axis 20, and parallel to the plane of the coil loops 12, in a manner to create a maximum opening on the proximal end 16 to slide over either the foot 26 or wrist 28, to accommodate superior positioning, and to serve as a positioning aid to maintain a relative distance between human tissue 30 and coil conductors 12. This maintains a more constant loading by the predominant loading mechanism—proximal human tissue—and therefore minimizes coil frequency shifts due to patient size variations. This leads to more optimal coil performance for each and every patient.

Figure 3:
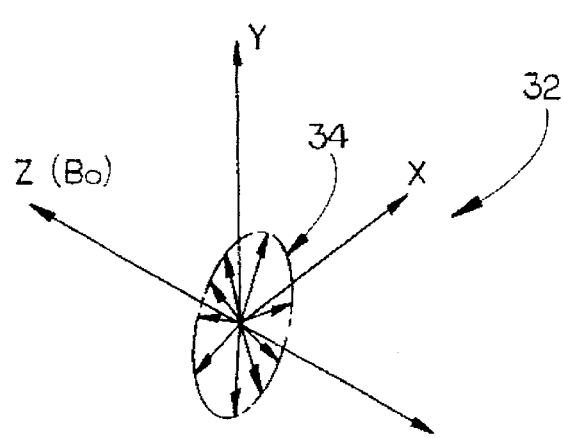
FIG. 3 is a perspective of a rotating magnetic moment in relation to the three-dimensional coordinate axis.

Referring now to FIG. 3, the precessing NMR signal is depicted as a spinning magnetic moment 34 about the z axis of the three dimensional coordinate system 32. This will serve as the source signal for the remaining discussions concerning FIGS. 4 through 6.

Figure 4:
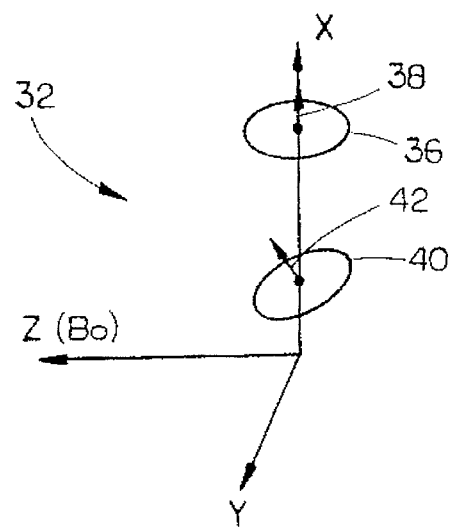
FIG. 4 is a perspective of various loop orientations resulting in different loop efficiencies.

Referring to FIG. 4, Faraday's Law of Induction predicts that the signal induced (by the spinning magnetic moment 34 of FIG. 3) in coil loop 36, described by orthogonal vector 38 will be larger than that signal induced in a similarly sized loop 40, described by orthogonal vector 42, given that the distance from the source is identical with both loops 36 and 40.

Figure 5:
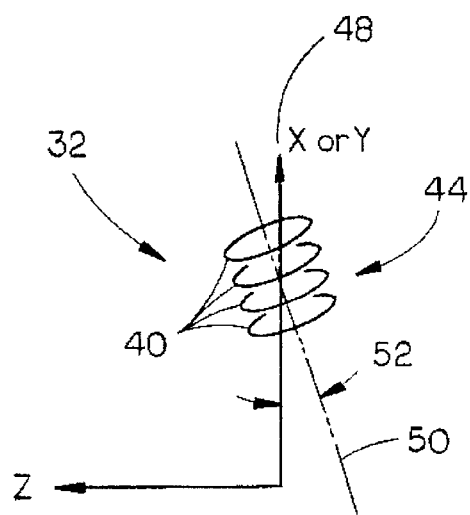
FIG. 5 represents a solenoidal configuration with respect to the transverse (X-Y) plane.
Figure 6:
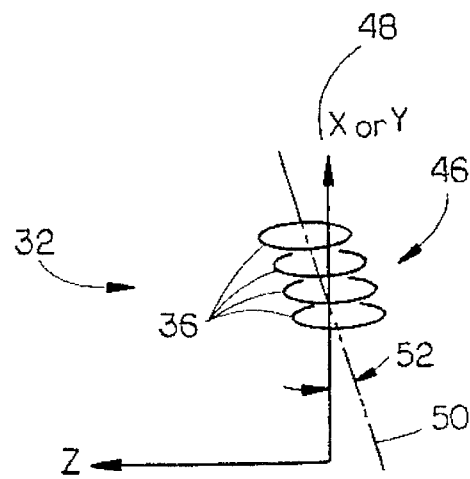
FIG. 6 represents a second solenoidal configuration with respect to the transverse (x,y) plane.

Referring now to FIGS. 5 and 6, two solenoids 44 and 46, comprised of identically sized loops 40 and 36, respectively, of equal numbers and equal spacing between loops, are shown relative to the transverse axis 48. Although the solenoid's longitudinal axes 50 are at the same angle 52 with respect to the transverse axis 48, solenoids 44 and 46 of FIGS. 5 and 6 perform quite differently. Each loop component 36 of solenoid 46 is in a plane which is orthogonal to the transverse axis 48 while each loop component 40 of solenoid 44 is in a plane at an angle 52 relative to axis 48. Hence, the efficiency of solenoid 44 is approximately equal to the cosine of angle 52 times the efficiency of solenoid 46. This implies that as angle 52 becomes larger, solenoid 46 becomes increasingly more efficient than solenoid 44.

Figure 7:
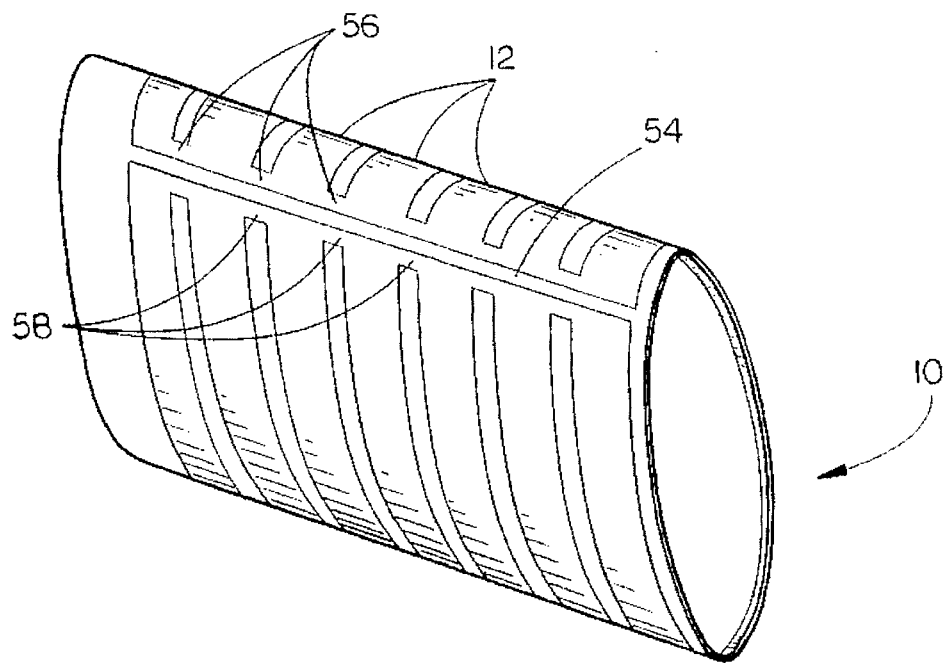
FIG. 7 is a perspective view similar to FIG. 1 but showing in diagrammatic form, the tuning networks, and improved conductor configurations of the coil.

Referring to FIG. 7, the detailed illustration of the conductor arrangement reveals the parallel-wound concept whereby all conductors 12 share a portion of the total circumferential current. The total current is distributed across all conductors 12 and remains approximately in-phase amongst all conductors 12 due to the equal distribution of capacitance along gap 54 and due to the interconnections 56 and 58 which electrically connect the similar ends of each conductor loop 12.

Forcing the total NMR current to be distributed amongst all conductors results in an efficiency improvement over series-wound solenoids due to the fact that coil circuit resistance is greatly reduced thereby inversely proportionally increasing the coil quality factor (Q). This is due to the relationship between coil Q and total resistance where $Q=X/R$ where X is the coil reactance and R is the total resistance including circuit resistance, eddy current-induced resistance, and dielectric resistive losses within the adjacent dielectric medium, coupled into the coil. Eddy-current induced resistive losses are due to magnetic field (due to currents on the coil) induced eddy currents, within a conductive medium (human tissue) which inductively couple to the coil and induce additional resistive loss. Dielectric losses are due to electric field (developed across the coil capacitive junctions) penetration into the conducting medium. Hence, all of these loss mechanisms combine to lower coil Q. Coil Q is proportional to the coil efficiency.

Although circuit resistance is only a minor part of the total resistive loss mechanisms in the NMR experiment, minimization of circuit resistance yields optimal Signal-to-Noise ratio. The total circuit resistance is decreased as the small resistance of each conductor loop is placed in parallel with one another; hence the total resistance is approximately 1/n times the resistance of one loop where n is the number of loops—discounting other radio-frequency coupling mechanisms whereby resistance is coupled into the circuit.

In contrast, in the series-wound configuration, all of the n conductor loop resistances add. Other electromagnetic coupling mechanisms are involved which reduce the otherwise obvious differential in total resistance between the parallel and series wound configurations such that they are not as disproportionate as n×r versus r/n where r is the resistance of one loop. The difference in total resistance is however, notable.

It is then an objective of this invention to optimize the efficiency of a solenoidal coil by properly orienting the parallel-wound individual loops while allowing comfortable and conformal placement adjacent to the anatomy of interest where the particular anatomy rests in a natural position such as in FIGS. 1 and 2.

Figure 8:
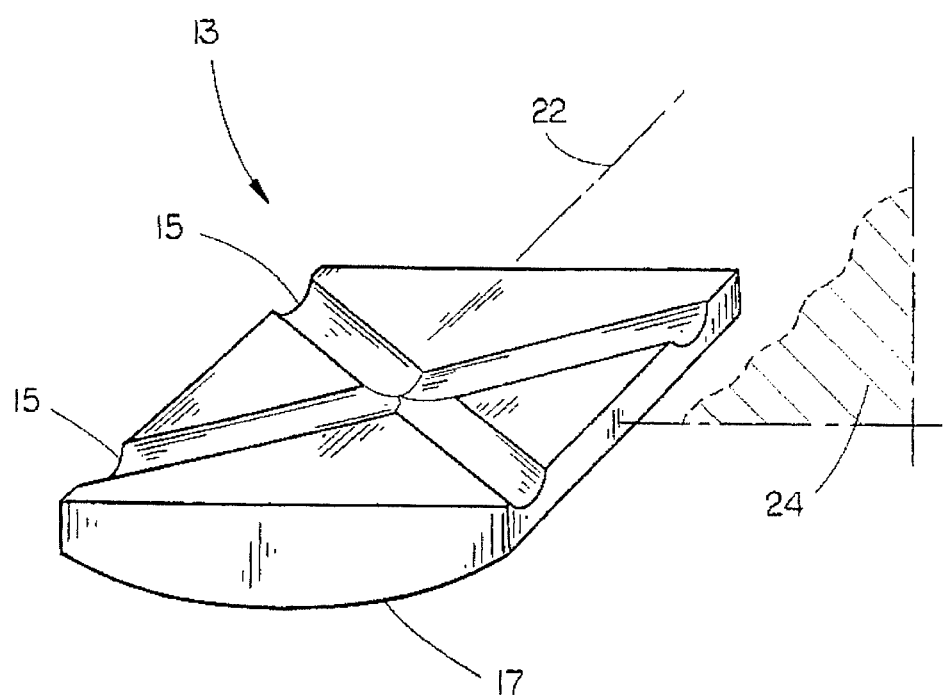
FIG. 8 is a perspective view of the positioning pad which assures proper alignment of the coil of FIGS. 1, 2, and 7, and provides for patient positioning and comfort as well.

Referring now to FIG. 8, proper coil orientation within the NMR imaging system is achieved by placement of the coil and anatomy (neither shown) within slots 15 cut in a foam positioning pad 13 which forces alignment of the individual loops of the coil such that they lie within planes orthogonal to the transverse plane 24 of the NMR imaging apparatus. The foam pad 13 sets within the NMR imaging table curvature 17; hence, maintaining alignment of the foam pad 13 with the longitudinal axis 22 of the NMR imaging apparatus.

Whereas the invention has been shown and described in connection with the preferred embodiments thereof, it will be understood that many modifications, substitutions and additions may be made which are within the intended broad scope of the appended claims. There has therefore been shown and described an improved NMR local coil which accomplishes at least all of the above stated objects.

I claim:

1. A NMR conformal solenoidal coil operable to detect an RF field in MRI, comprising:

a plurality of generally circular NMR conductors, uniformly spaced apart and parallel to one another and attached to a hollow generally cylindrical housing;

said conductors being electrically connected in parallel and in solenoidal fashion, and oriented with the geometric centers of the circular shape lying along the longitudinal axis of the housing;

said conductors being arranged in parallel planes oriented non-orthogonal relative to the longitudinal axis of the housing; and said conductors including means for electrically connecting the conductors to MRI equipment.

2. A NMR conformal solenoidal coil operable to detect an RF field in MRI, comprising:

a plurality of generally circular NMR conductors, uniformly spaced apart and parallel to one another and attached to a hollow generally cylindrical housing;

said conductors being electrically connected in parallel and in solenoidal fashion, and oriented with the geometric centers of the circular shape lying along the longitudinal axis of the housing;

said conductors being arranged in parallel planes oriented non-orthogonal relative to the longitudinal axis of the housing;

said housing having first and second ends, the first end having a generally circular cross-section and the second end having a generally elliptical cross-section, the housing gradually changing in cross-section between the ends; and said conductors including means for electrically connecting the conductors to MRI equipment.

3. The coil of claim 1 wherein said conductors are arranged within a single generally cylindrical plane.

4. The coil of claim 2, wherein said first and second ends have end surfaces which lie within planes which are non-orthogonal to the housing longitudinal axis.

5. The coil of claim 4, wherein said first end surface lies within a plane parallel to the planes of the conductors.

* * * * *